(12) United States Patent
Fang

(10) Patent No.: US 12,249,578 B2
(45) Date of Patent: Mar. 11, 2025

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventor: Hsu-Nan Fang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 592 days.

(21) Appl. No.: 17/356,199

(22) Filed: Jun. 23, 2021

(65) Prior Publication Data

US 2022/0415799 A1 Dec. 29, 2022

(51) Int. Cl.
*H01L 23/535* (2006.01)
*H01L 23/00* (2006.01)
*H01L 25/16* (2023.01)

(52) U.S. Cl.
CPC ............ *H01L 23/535* (2013.01); *H01L 24/32* (2013.01); *H01L 25/16* (2013.01); *H01L 24/73* (2013.01); *H01L 24/83* (2013.01); *H01L 2224/32145* (2013.01); *H01L 2224/73253* (2013.01); *H01L 2224/83896* (2013.01); *H01L 2924/19015* (2013.01); *H01L 2924/19041* (2013.01)

(58) Field of Classification Search
CPC ....... H01L 23/535; H01L 24/32; H01L 25/16; H01L 24/73; H01L 24/83; H01L 2224/32145; H01L 2224/73253; H01L 2224/83896; H01L 2924/19015; H01L 2924/19041
See application file for complete search history.

(56) References Cited

U.S. PATENT DOCUMENTS

| | | | | |
|---|---|---|---|---|
| 11,699,662 | B2* | 7/2023 | Greco | H01L 23/5386 257/48 |
| 2020/0294908 | A1* | 9/2020 | Haba | H01L 23/5383 |
| 2020/0402892 | A1* | 12/2020 | Chen | H01L 23/5383 |
| 2021/0036097 | A1* | 2/2021 | Tsai | H01L 29/945 |
| 2021/0151345 | A1* | 5/2021 | Liang | H01L 21/707 |
| 2021/0375856 | A1* | 12/2021 | Alcorn | H01L 23/498 |
| 2022/0406523 | A1* | 12/2022 | Kamgaing | H01G 4/40 |

* cited by examiner

*Primary Examiner* — Benjamin Tzu-Hung Liu
(74) *Attorney, Agent, or Firm* — FOLEY & LARDNER LLP

(57) ABSTRACT

A semiconductor package structure and a method of manufacturing the same are provided. The semiconductor package structure includes an electronic component having a first surface, a second surface opposite to the first surface and a circuit structure closer to the first surface than to the second surface. The semiconductor package structure also includes a passive component connected to the second surface of the electronic component. The semiconductor package structure further includes a conductive element extending into the electronic component and configured to electrically connect the circuit structure with the passive component.

5 Claims, 18 Drawing Sheets

SEMICONDUCTOR PACKAGE STRUCTURE AND METHOD FOR MANUFACTURING THE SAME

BACKGROUND

1. Field of the Disclosure

The present disclosure relates to a semiconductor package structure, and particularly to a semiconductor package structure integrating an electronic component and a passive element.

2. Description of the Related Art

When a passive element is integrated with an electronic component in a semiconductor package structure, the distance therebetween and the size of the passive element can affect the performance of the passive element. However, it is difficult to satisfy requirements for both shorter distance and greater size of the passive element. In order to enhance the performance of the passive element, a new semiconductor package structure is thus required.

SUMMARY

In some embodiments, a semiconductor package structure includes an electronic component having a first surface, a second surface opposite to the first surface and a circuit structure closer to the first surface than to the second surface. The semiconductor package structure also includes a passive component connected to the second surface of the electronic component. The semiconductor package structure further includes a conductive element extending into the electronic component and configured to electrically connect the circuit structure with the passive component.

In some embodiments, a semiconductor package structure includes an electronic component having an active surface and a backside surface opposite to the active surface. The semiconductor package structure also includes a passive component connected to the backside surface of the electronic component. The passive component is closer to the backside surface than to the active surface of the electronic component. The passive component is configured to adjust a power to the electronic component.

In some embodiments, a method for manufacturing a semiconductor package structure includes: providing a device comprising an electronic component having an active surface and a backside surface opposite to the active surface, a passive component connected to the backside surface of the electronic component, wherein the passive component is closer to the backside surface than to the active surface of the electronic component; and providing a signal transmission path from the passive component into the electronic component, wherein the signal transmission path is configured for transmitting power.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
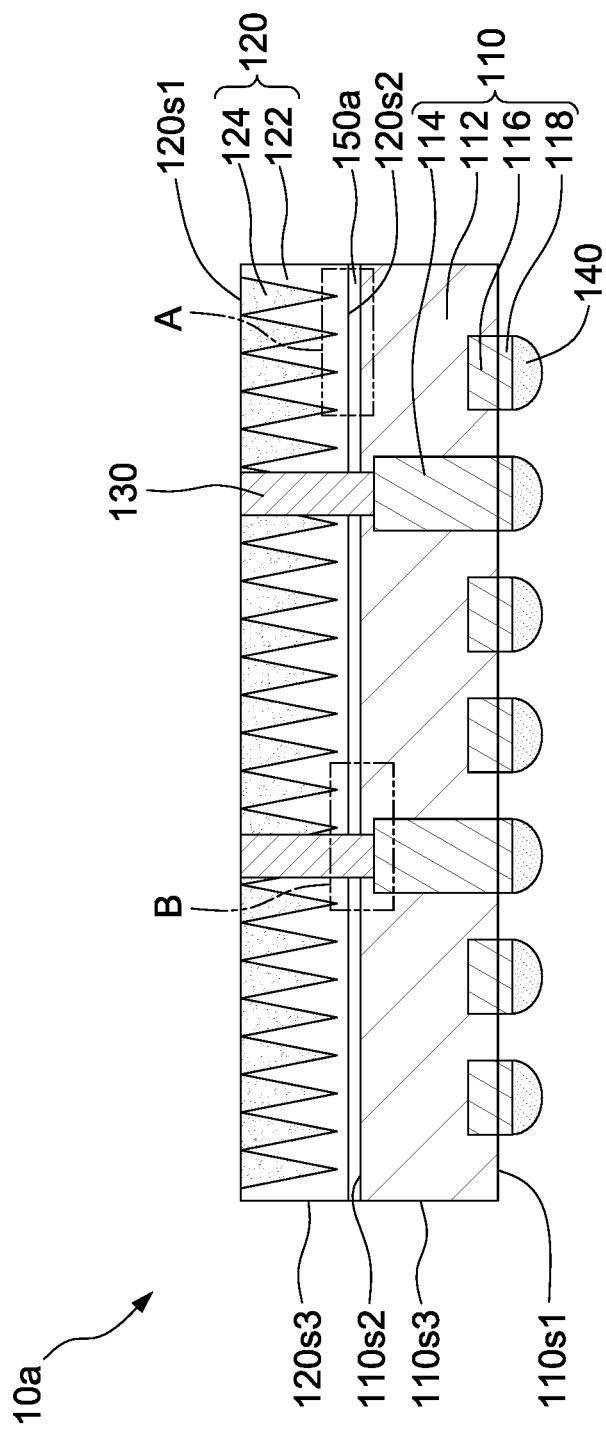
FIG. 1 illustrates a cross-sectional view of an example of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein the term "active surface" may refer to a surface of an electronic component or passive element on which contact terminals such as contact pads are disposed.

FIG. 1 illustrates a cross-sectional view of an example of a semiconductor package structure 10a according to some embodiments of the present disclosure.

In some embodiments, the semiconductor package structure 10a may include an electronic component 110, a passive component 120, a conductive element 130, a conductive terminal 140 and a dielectric layer 150a (or a dielectric structure).

The electronic component 110 may include an active component. The active component may include a semiconductor die or a chip, such as a logic die (e.g., application processor (AP), system-on-a-chip (SoC), central processing unit (CPU), graphics processing unit (GPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies) or other active components. In some embodiments, the electronic component 110 may include a plurality of transistors, diodes, or other active components. The transistor may include bipolar junction transistor, metal-oxide-semiconductor field-effect transistor (MOSFET), junction gate field-effect transistor (JFET) and other transistors. The diode may include Zener diode, photodiode, Schottky diode and other diodes. In some embodiments, the electronic component 110 may have an active surface $110s1$ and a backside surface $110s2$ opposite to the active surface $110s1$. The electronic component 110 may include a lateral surface $110s3$ extending between the active surface $110s1$ and the backside surface $110s2$.

The electronic component 110 may include a substrate 112, a conductive via 114, a circuit structure 116 and a conductive trace 118. The substrate 112 may include a semiconductor substrate. The substrate 112 may include silicon or germanium in a single crystal form, a polycrystalline form, or an amorphous form.

The conductive via 114 may be embedded in the substrate 112 of the electronic component 110. The conductive via 114 may be electrically connected to the conductive element 130. The conductive via 114 may be configured to electrically connect the conductive element 130 and the conductive terminal 140. The conductive via 114 may be configured to adjust the thickness of the conductive element 130 such that the conductive element 130 may have a suitable aspect ratio. For example, the conductive via 114 may assist in reducing the thickness of the conductive element 130. In some embodiments, the conductive via 114 may partially penetrates the substrate 112 of the electronic component 110. The conductive via 114 may not fully penetrate the substrate 112 of the electronic component 110. In some embodiments, the conductive via 114 may be in contact with the conductive element 130. The conductive via 114 may include, for example, through-silicon via (TSV). The conductive via 114 may include copper, tin, aluminum, gold, silver, tungsten, nickel, a combination thereof or other suitable materials. In some embodiments, the conductive via 114 may be exposed by the active surface $110s1$ of the electronic component 110.

The circuit structure 116 may be embedded in the substrate 112 of the electronic component 110. The circuit structure 116 may be disposed adjacent to the active surface $110s1$ of the electronic component 110. The circuit structure 116 may be electrically connected to the conductive terminal 140. The circuit structure 116 may have a material substantially the same as or similar to that of the conductive via 114. In some embodiments, the thickness of the circuit structure 116 may be less than the thickness of the conductive via 114.

The conductive trace 118 may be disposed on the active surface $110s1$ of the electronic component 110. The conductive trace 118 may electrically connect the conductive via 114 with the conductive terminal 140. The conductive trace 118 may electrically connect the circuit structure 116 with the conductive terminal 140.

In some embodiments, the passive component 120 is disposed on the backside surface $110s2$ of the electronic component 110. In some embodiments, the passive component 120 may be configured to consume or store energy. In some embodiments, a power is transmitted to the electronic component 110 through the passive component 120, and the passive component 120 may be configured to adjust the power to the electronic component 110. In some embodiments, the passive component 120 may be configured to stabilize a voltage of the input of the electronic component 110. In some embodiments, the passive component 120 may be configured to adjust a signal of an output of the electronic component 110. In some embodiments, the passive component 120 may be configured to adjust a power signal of the electronic component. In some embodiments, the passive component 120 may be configured to stabilize a voltage of the output of the electronic component 110. In some embodiments, the passive component 120 may be configured to adjust a data signal of input of the electronic component 110. In some embodiments, the passive component 120 may be configured to filter the data signal. In some embodiments, the passive component 120 may include a capacitor, inductor, resistor, filter, or a combination of such components. In some embodiments, the passive component 120 may include a capacitor, such as a deep trench capacitor (DTC), a multi-layer ceramic capacitor (MLCC) or other capacitors, which may be configured to filter high frequency signals and/or low frequency signals.

The passive component 120 may include an active surface $120s1$ and a backside surface $120s2$ opposite to the active surface $120s1$. In some embodiments, the backside surface $120s2$ of the passive component 120 may be connected to the backside surface $110s2$ of the electronic component 110. That is, the backside surface $120s2$ of the passive component 120 may face the backside surface $110s2$ of the electronic component 110. The passive component 120 may include a lateral surface $120s3$ extending between the active surface $120s1$ and the backside surface $120s2$. In some embodiments, the lateral surface $120s3$ of the passive component 120 is substantially coplanar with the lateral surface $110s3$ of the electronic component 110. In some embodiments, the width of the passive component 120 is substantially identical to that of the electronic component 110.

The passive component 120 may include a substrate 122 and a conductive structure 124. The substrate 122 may include a semiconductor substrate. The substrate 122 may include silicon or germanium in a single crystal form, a polycrystalline form, or an amorphous form.

The conductive structure 124 may extend between the active surface $120s1$ and the backside surface $120s2$. In some embodiments, the conductive structure 124 and the substrate 122 may collaboratively form multiple metal-insulator-metal (MIM) structures.

The conductive element 130 may be configured to electrically connect the electronic component 110 with the passive component 120. In some embodiments, the conductive element 130 may extend within the electronic component 110. In some embodiments, the conductive element 130 may partially penetrate the electronic component 110. In some embodiments, the conductive element 130 may extend within the passive component 120. In some embodiments, the conductive element 130 may fully penetrate the passive component 120. In some embodiments, the conductive element 130 may extend between the active surface $120s1$ of the passive component 120 and the conductive via 114 of the electronic component 110. In some embodiments, the conductive element 130 may be exposed by the active surface $120s1$ of the passive component 120. In some embodiments, the conductive element 130 may penetrate the dielectric layer $150a$.

The conductive terminal 140 may be disposed on the active surface 110s1 of the electronic component 110. The conductive terminal 140 may be configured to electrically connect the electronic component 110 to other electronic components (not shown). In some embodiments, the conductive terminal 140 may include solder balls (e.g., Sn ball).

The dielectric layer 150a may be disposed between the backside surface 110s2 of the electronic component 110 and the backside surface 120s2 of the passive component 120. The dielectric layer 150a may be formed during connection of the electronic component 110 and the passive component 120. The dielectric layer 150a may include oxide or other suitable materials. In some embodiments, the dielectric layer 150a may include oxide (or oxygen atom or ion) that forms covalence bonds with the substrate 112 of the electronic component 110 and with the substrate 122 of the passive component 120. In some embodiments, the thickness of the dielectric layer 150a may range from about 0.3 nm to about 5 nm. The dielectric layer 150a may be detected by energy-dispersive X-ray spectroscopy (EDX), scanning electron microscope (SEM) or other suitable methods and/or apparatus.

Figure 2:
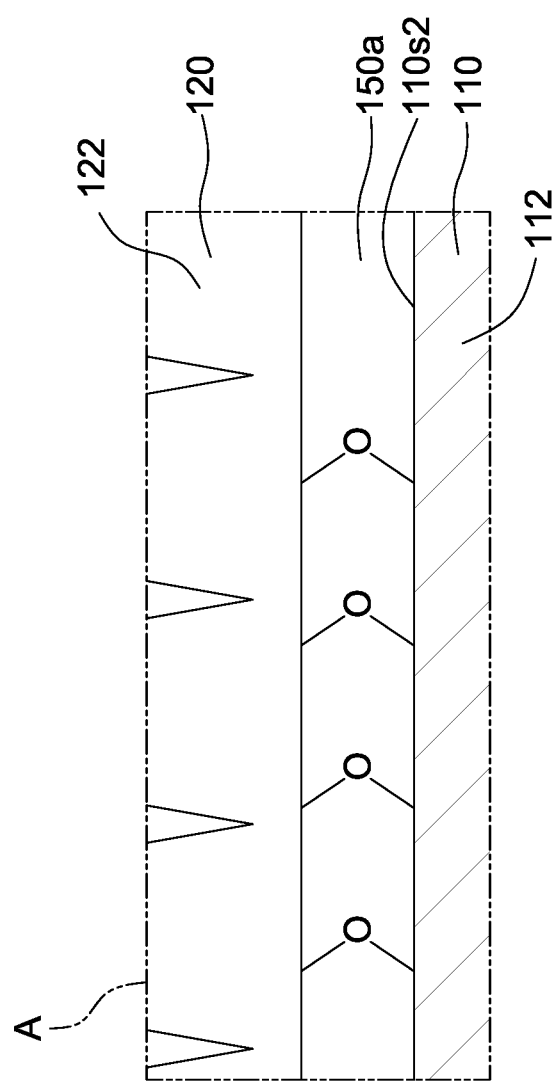
FIG. 2 is an enlarged view of region A of the semiconductor package structure shown in FIG. 1 according to some embodiments of the present disclosure.

FIG. 2 is an enlarged view of region A of the semiconductor package structure 10a shown in FIG. 1 according to some embodiments of the present disclosure.

In some embodiments, the dielectric layer 150a may include, for example, an oxide layer, formed between the backside surface 110s2 of the electronic component 110 and the backside surface 120s2 of the passive component 120. In some embodiments, the electronic component 110 is connected with the passive component 120 by a fusion bond operation. The fusion bond operation may deal with, for example, bonding of single materials. During the fusion bond operation, covalence bonds may be formed between the oxygen atom (or ion) and the substrate 112 of the electronic component 110 as well as between the oxygen atom (or ion) and the substrate 122 of the passive component 120. For example, the interface between the electronic component 110 and the passive component 120 may include a fusion bond, which includes covalence bond of oxygen and silicon. In some embodiments, the portion of the electronic component 110 in contact with the dielectric layer 150a and the portion of the passive component 120 in contact with the dielectric layer 150a include a same material, such as silicon or other suitable materials. In some embodiments, the dielectric layer 150a may be regarded as a portion of the passive component 120 and/or a portion of the electronic component such that the passive component 120 can be regarded as being in contact with the electronic component 110.

Figure 3:
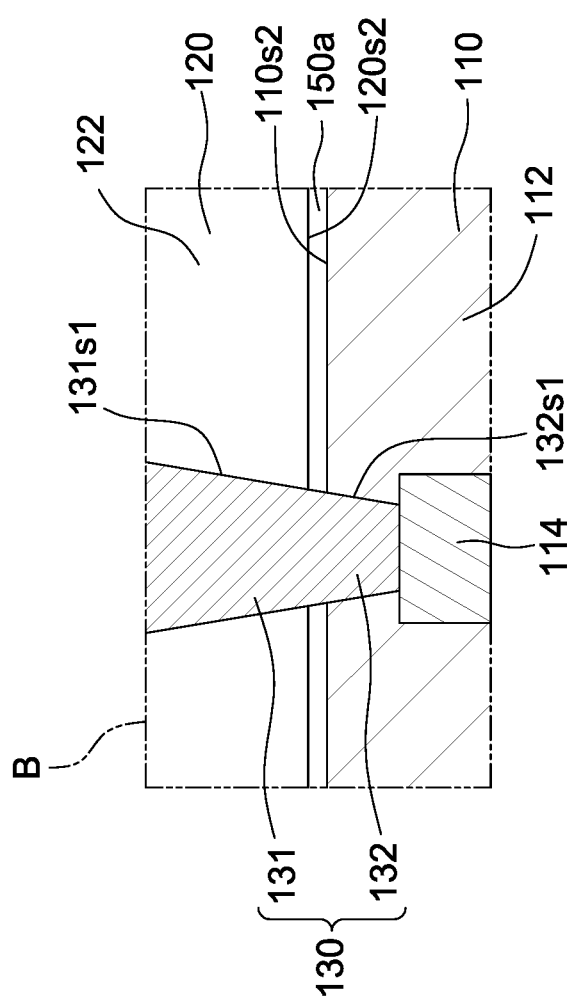
FIG. 3 is an enlarged view of region B of the semiconductor package structure shown in FIG. 1 according to some embodiments of the present disclosure.

FIG. 3 is an enlarged view of region B of the semiconductor package structure 10a shown in FIG. 1 according to some embodiments of the present disclosure.

In some embodiments, the conductive element 130 may have an uneven width. In some embodiments, the conductive element 130 is tapered from the passive component 120 to the electronic component 110. In some embodiments, the width of the conductive element 130 is different from the width of the conductive via 114. In some embodiments, the width of the conductive element 130 is less than the width of the conductive via 114 at the interface between the conductive via 114 and the conductive element 130. In some embodiments, the conductive via 114 may have a substantial uniform width compared to the conductive element 130. The conductive element 130 may include a portion 131 surrounded or encapsulated by the substrate 122 of the passive component 120 and a portion 132 surrounded or encapsulated by the substrate 112 of the electronic component 110. In some embodiments, a sidewall 131s1 of the portion 131 and a sidewall 132s1 of the portion 132 may have the same substantial roughness. In some embodiments, the conductive element 130 and the conductive via 114 of the electronic component 110 may include the same material. In some embodiments, the conductive element 130 and the conductive via 114 of the electronic component 110 may include different materials. In some embodiments, a grain size of conductive element 130 is different from a grain size of the conductive via 114 of the electronic component 110. For example, in the embodiment in which both the conductive element 130 and the conductive via 114 include copper, the grain size of copper of the conductive element 130 is different from the grain size of copper of the conductive via 114.

In a comparative example, a passive component is disposed on an active surface of an electronic component. The surface area of the passive component may affect the number of I/Os of the electronic component, and therefore the surface area of the passive component is limited. Further, in the comparative example, a package body is disposed on the active surface of the electronic component and encapsulates the passive component, and a conductive pillar penetrates the package body to electrically connect I/Os of the electronic component. Since the thickness of the conductive pillar cannot be too great to ensure the rigidity of the conductive pillar, the thickness of the passive component is limited. In this embodiment, the passive component 120 is disposed on the backside surface 110s2 of the electronic component 110, causing substantially no impact on the number of I/Os of the electronic component 110. Therefore, the surface area of the passive component 120 can be as large as possible. Further, since no conductive pillars are formed in this embodiment, the thickness of the passive component 120 is also not limited. As a result, the size of the passive component 120 can be increased, enhancing the performance of the semiconductor package structure 10a.

Figure 4:
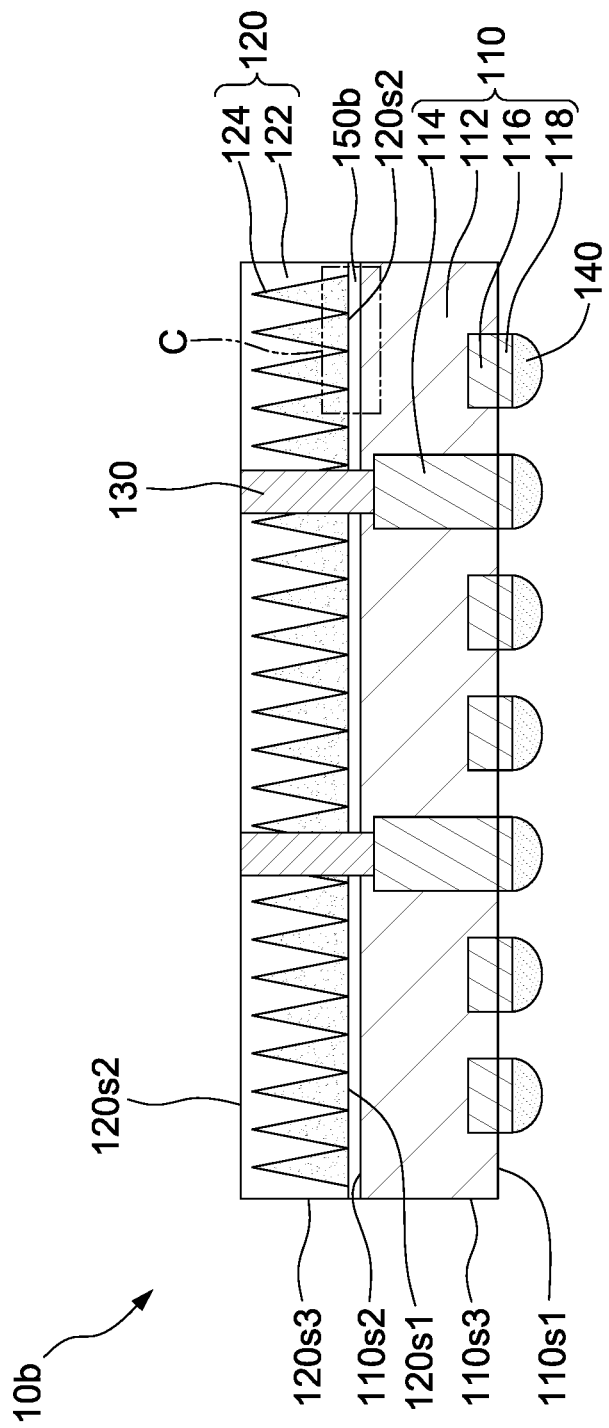
FIG. 4 illustrates a cross-sectional view of an example of a semiconductor package structure according to some embodiments of the present disclosure.

FIG. 4 illustrates a cross-sectional view of an example of a semiconductor package structure 10b according to some embodiments of the present disclosure. The semiconductor package structure 10b of FIG. 4 has a structure similar to that of the semiconductor package structure 10a of FIG. 1 with differences that the active surface 120s1 of the passive component 120 faces the backside surface 110s2 of the electronic component 110 in the semiconductor package structure 10b.

In some embodiments, the passive component 120 may be disposed on the backside surface 110s2 of the electronic component 110. In some embodiments, the backside surface 120s2 of the passive component 120 may face away from the electronic component 110. In some embodiments, the dielectric layer 150b (or a dielectric structure) may be disposed between the active surface 120s1 of the passive component 120 and the backside surface 110s2 of the electronic component 110.

Figure 5:
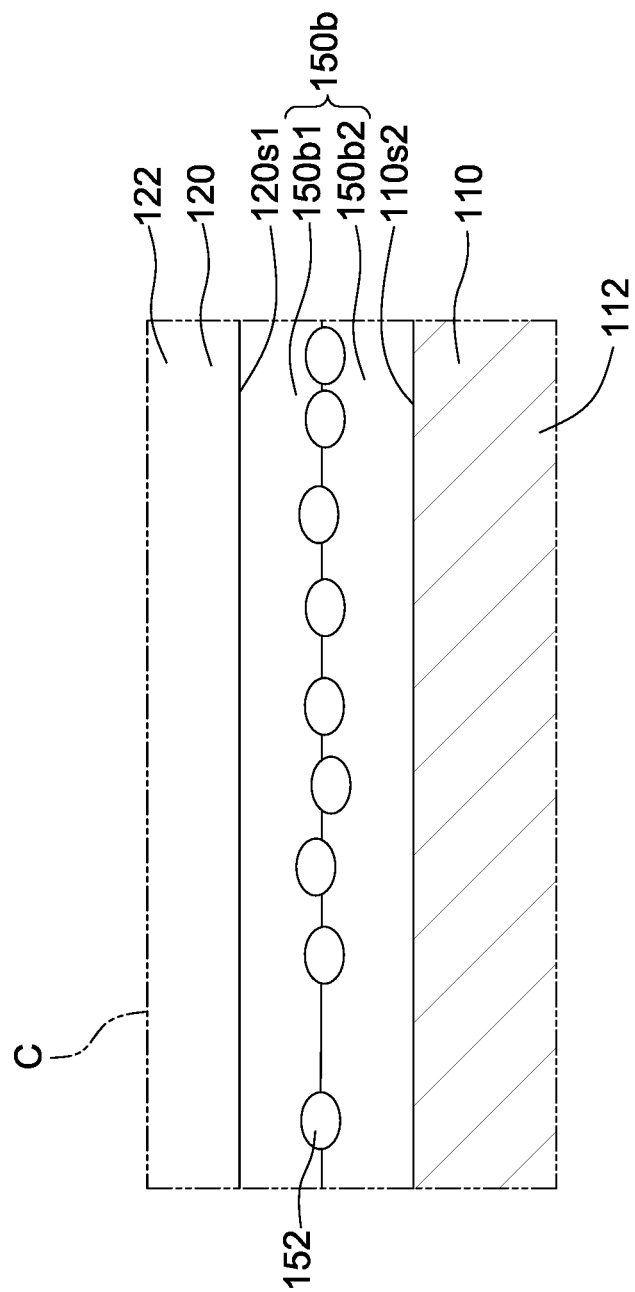
FIG. 5 is an enlarged view of region C of the semiconductor package structure shown in FIG. 1 according to some embodiments of the present disclosure.

FIG. 5 is an enlarged view of region C of the semiconductor package structure 10b shown in FIG. 1 according to some embodiments of the present disclosure.

In some embodiments, the dielectric layer 150b may include a layer 150b1 in contact with the passive component 120 and a layer 150b2 in contact with the electronic component 110. Each of the layer 150b1 and the layer 150b2 may include an oxide layer, such as a silicon oxide layer. In some embodiments, a plurality of voids 152 may be located at an interface between the layer 150b1 and the layer 150b2.

The voids 152 may be located in the dielectric layer 150*b*. The voids 152 may include, for example, gas.

In this embodiment, the passive component 120 is disposed on the backside surface 110*s*2 of the electronic component 110, causing substantial no impact on the number of I/Os of the electronic component 110. Therefore, the surface area of the passive component 120 can be as large as possible. Further, since no conductive pillars are formed in this embodiment, the thickness of the passive component 120 is also not limited. As a result, the size of the passive component 120 can be increased, enhancing the performance of the semiconductor package structure 10*b*.

FIGS. 6A, 6B, 6C, 6D, 6E, 6F, and 6G illustrate various stages of an example of a method for manufacturing a semiconductor package structure 10*a* according to some embodiments of the present disclosure.

Figure 6A:
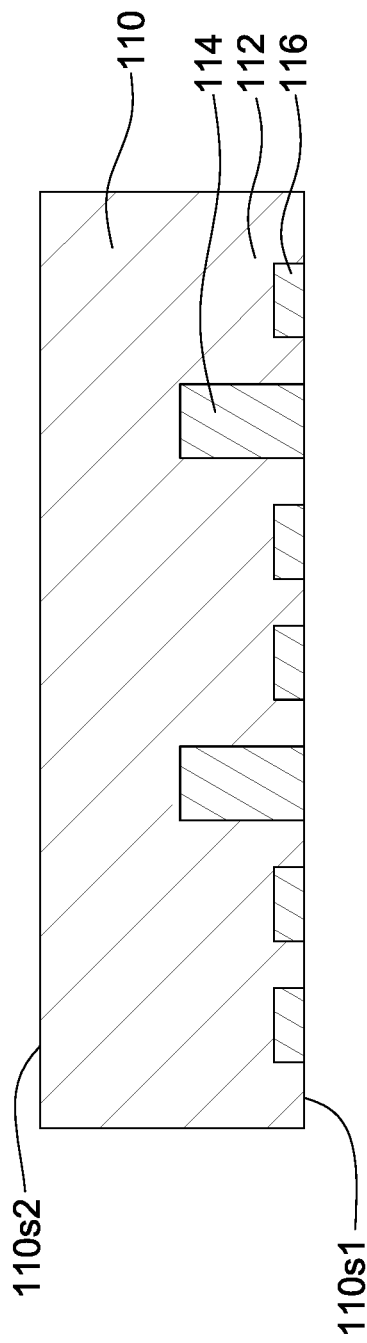
FIGS. 6A, 6B, 6C, 6D, 6E, 6F, and 6G illustrate various stages of an example of a method for manufacturing a semiconductor package structure according to some embodiments of the present disclosure.

Referring to FIG. 6A, an electronic component 110 is provided. The electronic component 110 may include an active surface 110*s*1 and a backside surface 110*s*2 opposite to the active surface 110*s*1. The electronic component 110 may include a substrate 112, a conductive via 114, and a circuit layer 116. The substrate 112 may have a thickness ranging from about 700 μm to about 1200 μm.

Figure 6B:
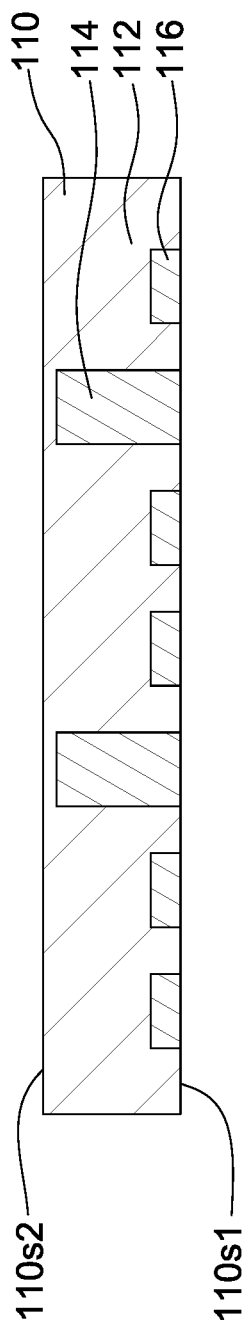

Referring to FIG. 6B, a thinning operation is performed on the substrate 112 of the electronic component 110 such that the substrate 112 may have a thickness ranging from about 400 μm to about 800 μm. After thinning the substrate 112, the conductive via 114 is not exposed by the backside surface 110*s*2 of the 100.

Figure 6C:
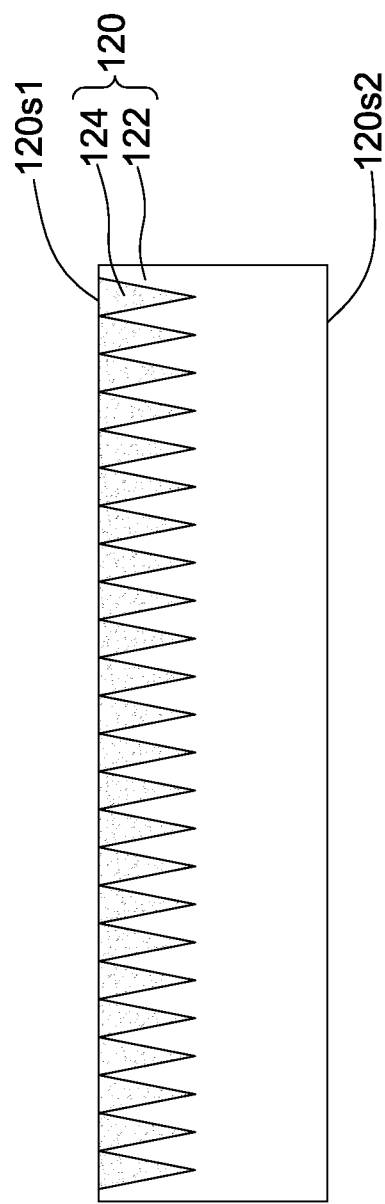

Referring to FIG. 6C, a passive component 120 is provided. The passive component 120 may include an active surface 120*s*1 and a backside surface 120*s*2. The passive component 120 may include a substrate 122 and a conductive structure 124 embedded in the substrate 122.

Figure 6D:
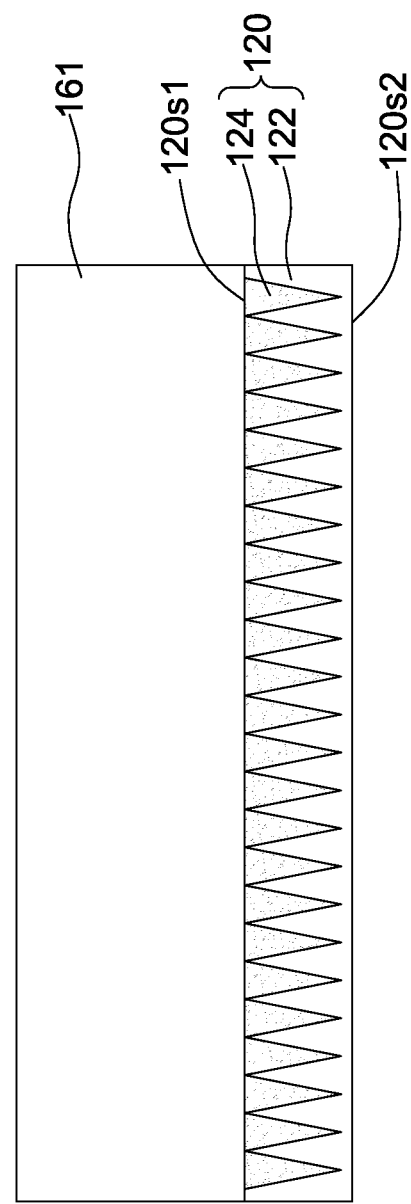

Referring to FIG. 6D, a carrier 161 is provided. The active surface 120*s*1 of the passive component 120 is attached to the carrier 161. Further, a thinning operation is performed on the substrate 122 of the passive component 120 such that the substrate 122 may have a thickness ranging from about 30 μm to about 100 μm.

Figure 6E:
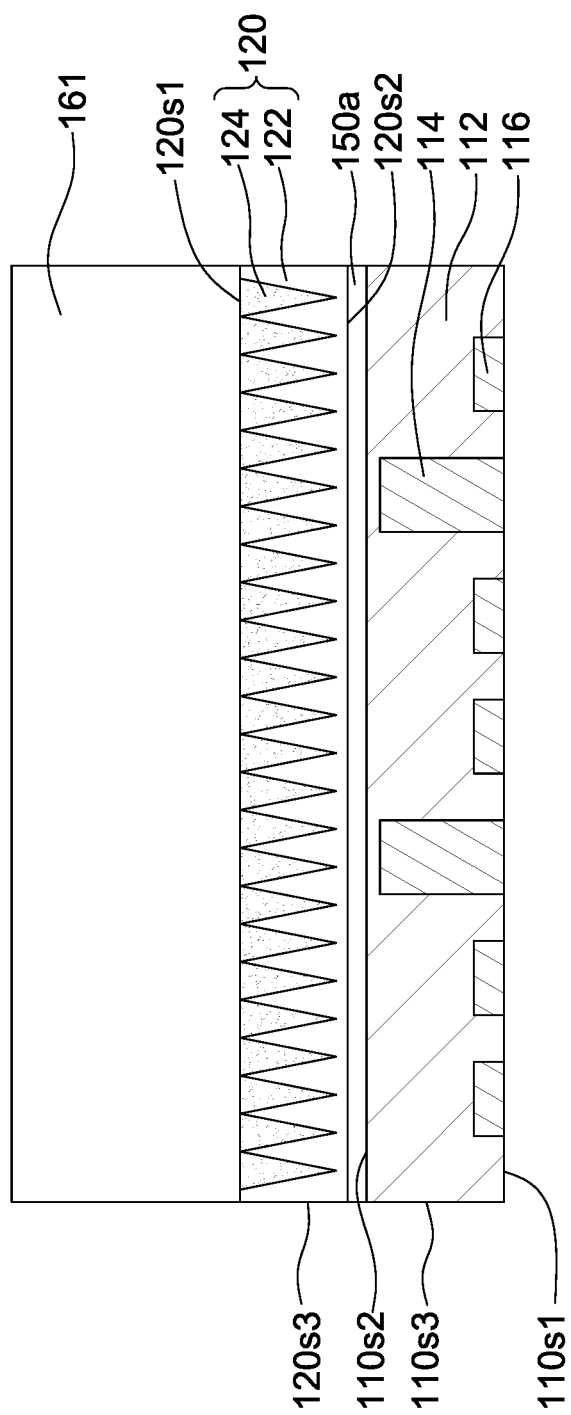

Referring to FIG. 6E, the passive component 120 is connected with the electronic component 110. In some embodiments, the backside surface 120*s*2 of the passive component 120 is bonded to the backside surface 110*s*2 of the electronic component 110. In some embodiments, a fusion bond operation is performed such that the passive component 120 is connected with the electronic component 110. In some embodiments, both the substrate 112 and the substrate 122 include silicon, and the substrate 112 may be connected to the substrate 122 by the fusion bond operation. During the fusion bond operation, oxygen molecule may interact with the surface of the substrate 112 and the substrate 122. As a result, covalence bonds of oxygen and silicon may be formed, enhancing the bonding strength between the electronic component 110 and the passive component 120. In some embodiments, a dielectric layer 150*a* may be formed between the electronic component 110 and the passive component 120.

Figure 6F:
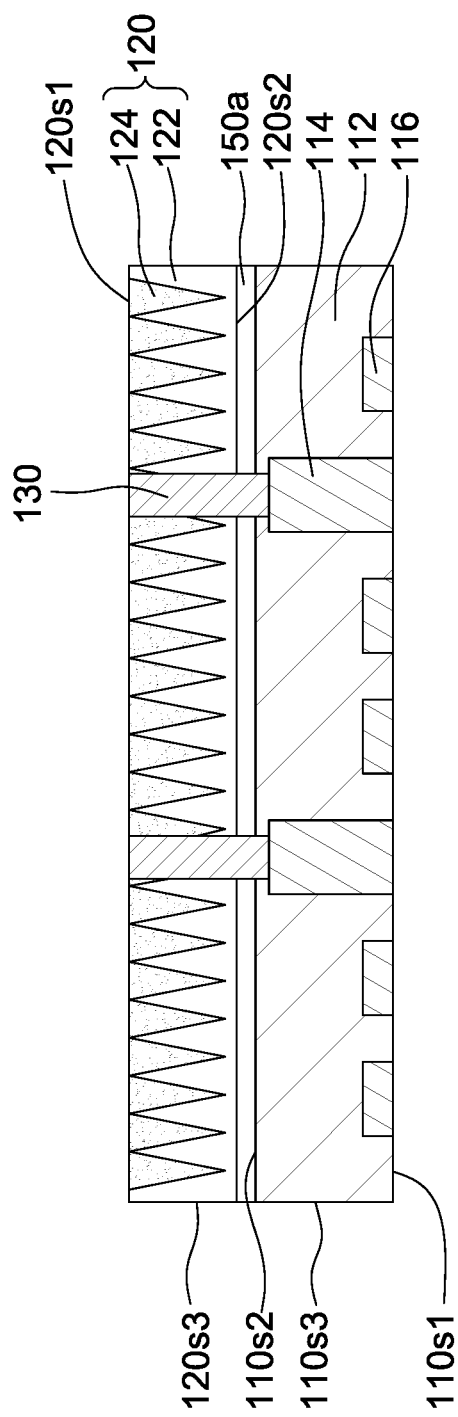

Referring to FIG. 6F, the carrier 161 may be removed, and a conductive element 130 may be formed. In some embodiments, an etching operation is performed to form openings fully penetrating the passive component 120 and partially penetrating the electronic component 110, wherein the conductive via 114 may be exposed by the openings. Next, a conductive material is formed in the openings to form the conductive element 130.

Figure 6G:
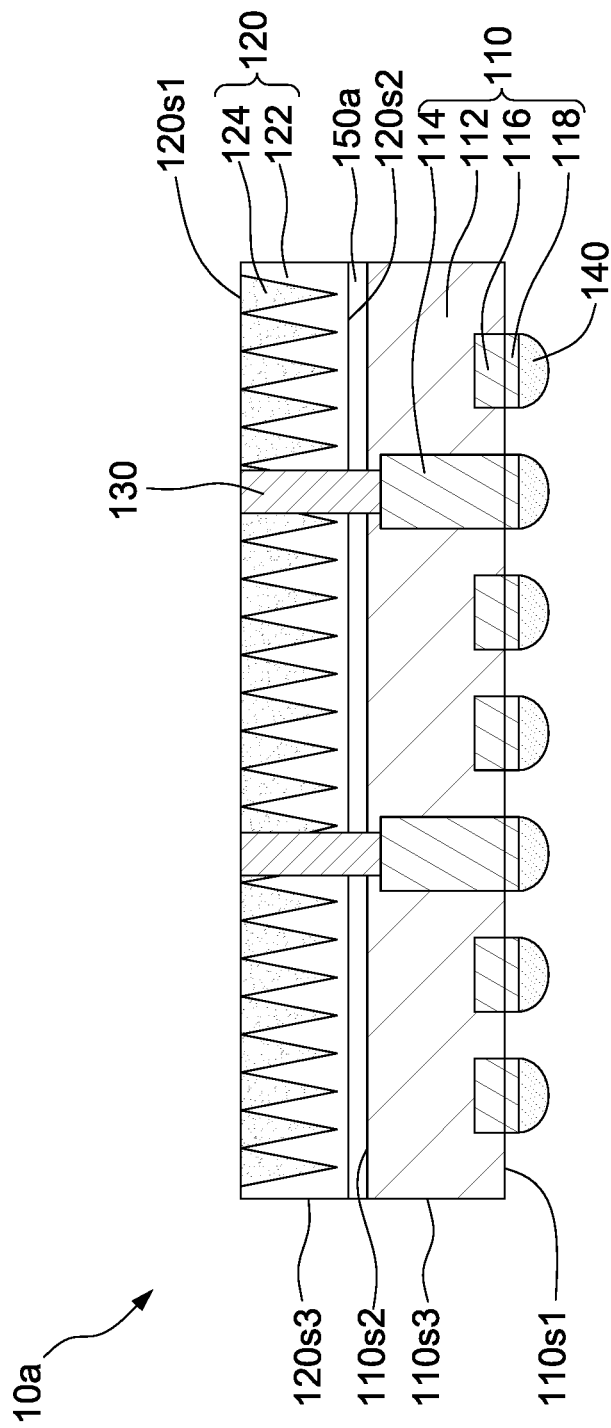

Referring to FIG. 6G, a conductive trace 118 and a conductive terminal 140 are formed on the active surface 110*s*1 of the electronic component 110. As a result, the semiconductor package structure 10*a* is formed.

Figure 7A:
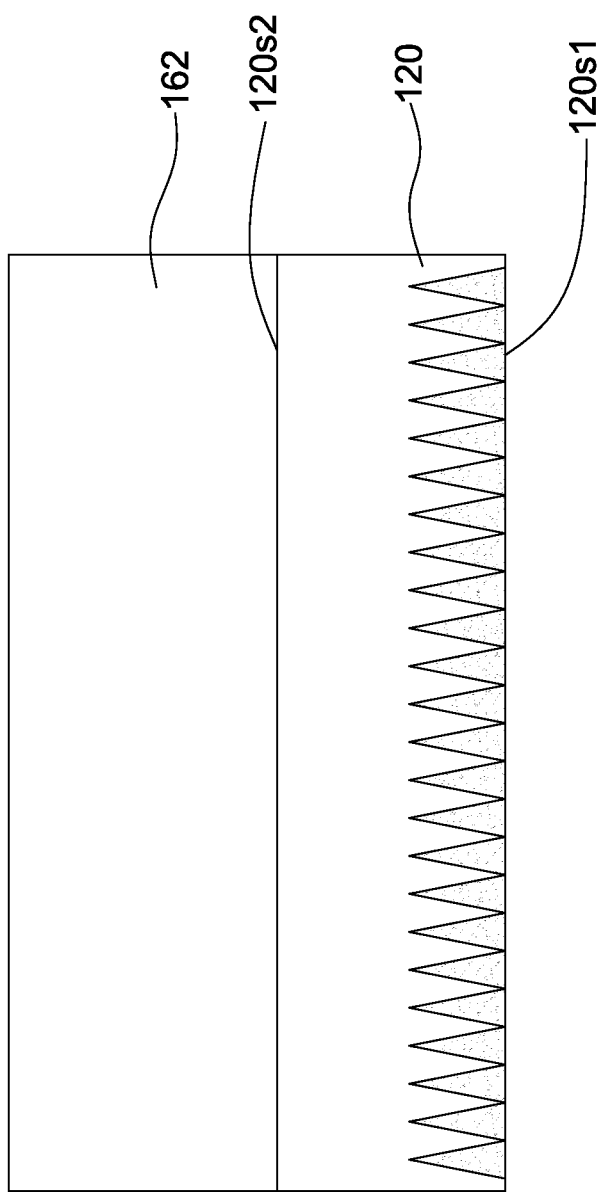
FIGS. 7A, 7B, 7C, 7D, 7E, 7F, and 7G illustrate various stages of an example of a method for manufacturing a semiconductor package structure according to some embodiments of the present disclosure.

FIG. 7A through FIG. 7G illustrate a method for manufacturing a semiconductor package structure 10*b* according to some embodiments of the present disclosure. The initial stage of the illustrated process is the same as, or similar to, the stages illustrated in FIG. 6A through FIG. 6C. FIG. 7A depict a stage subsequent to that depicted in FIG. 6C.

Referring to FIG. 7A, a carrier 162 is provided. The backside surface 120*s*2 of the passive component 120 is attached to the carrier 162.

Figure 7B:
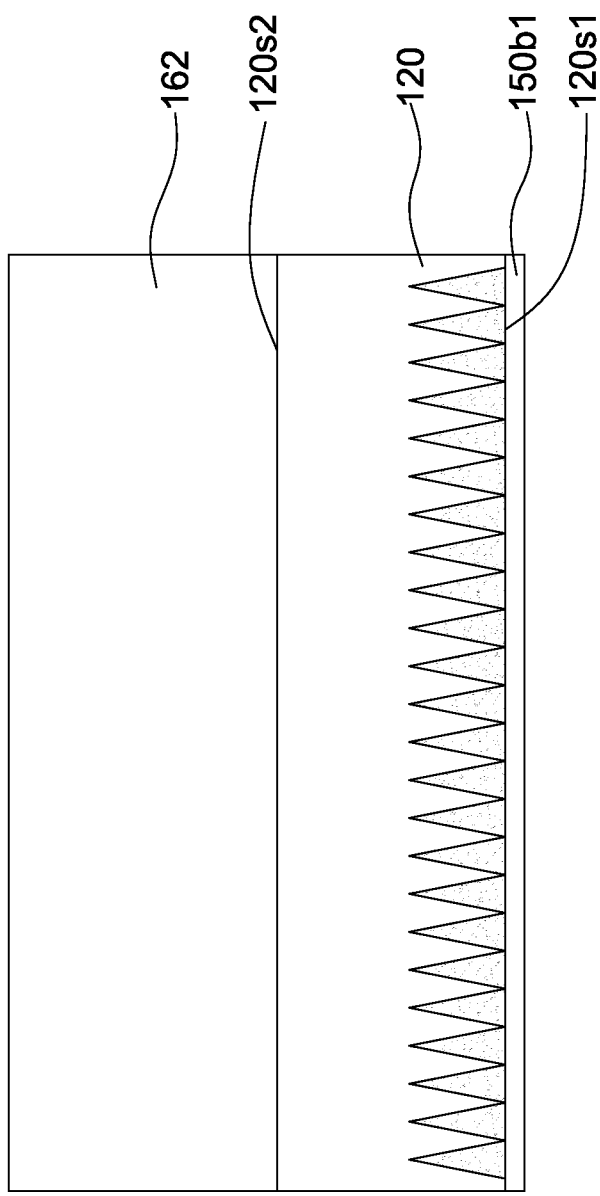

Referring to FIG. 7B, a layer 150*b*1, such as an oxide layer, is formed on the active surface 120*s*1 of the passive component 120.

Figure 7C:
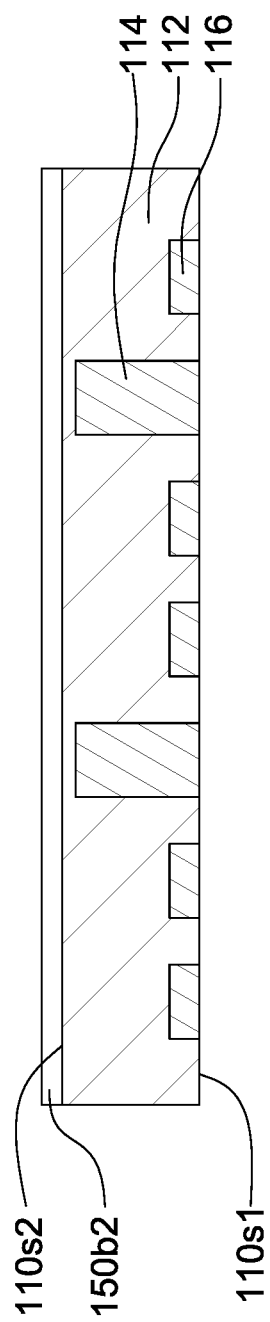

Referring to FIG. 7C, a layer 150*b*2, such as an oxide layer, is formed on the backside surface 110*s*2 of the passive component 120.

Figure 7D:
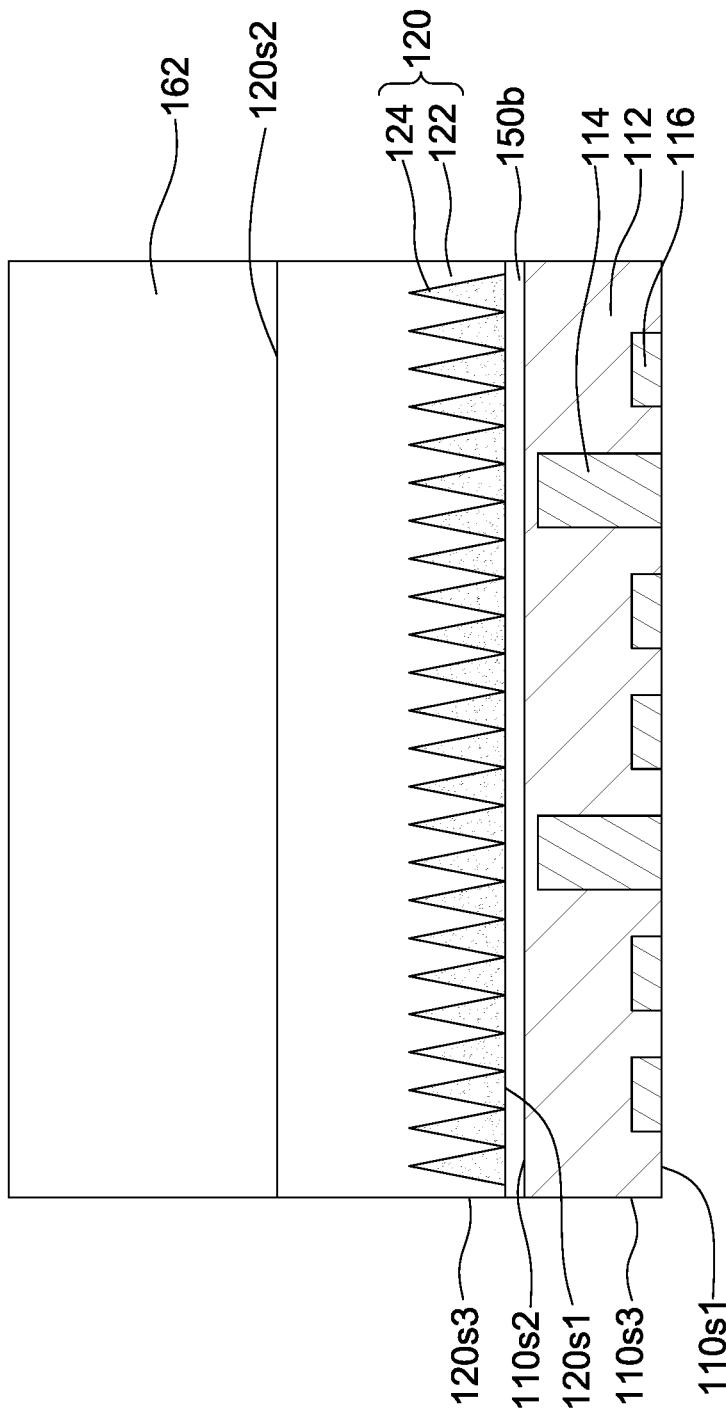

Referring to FIG. 7D, the passive component 120 is connected with the electronic component 110. In some embodiments, the active surface 120*s*1 of the passive component 120 is bonded to the backside surface 110*s*2 of the electronic component 110. In some embodiments, a fusion bond operation is performed such that the layer 150*b*1 is bonded to the layer 150*b*2. As a result, the passive component 120 is connected with the electronic component 110. In some embodiments, both the electronic component 110 and the passive component 120 may include, for example, an oxide layer, and the electronic component 110 may be connected to the passive component 120 by the fusion bond operation. The dielectric layer 150*b* is formed between the electronic component 110 and the passive component 120. In some embodiments, a plurality of voids (e.g., the voids 152 shown in FIG. 5) are formed during the formation of the dielectric layer 150*b*.

Figure 7E:
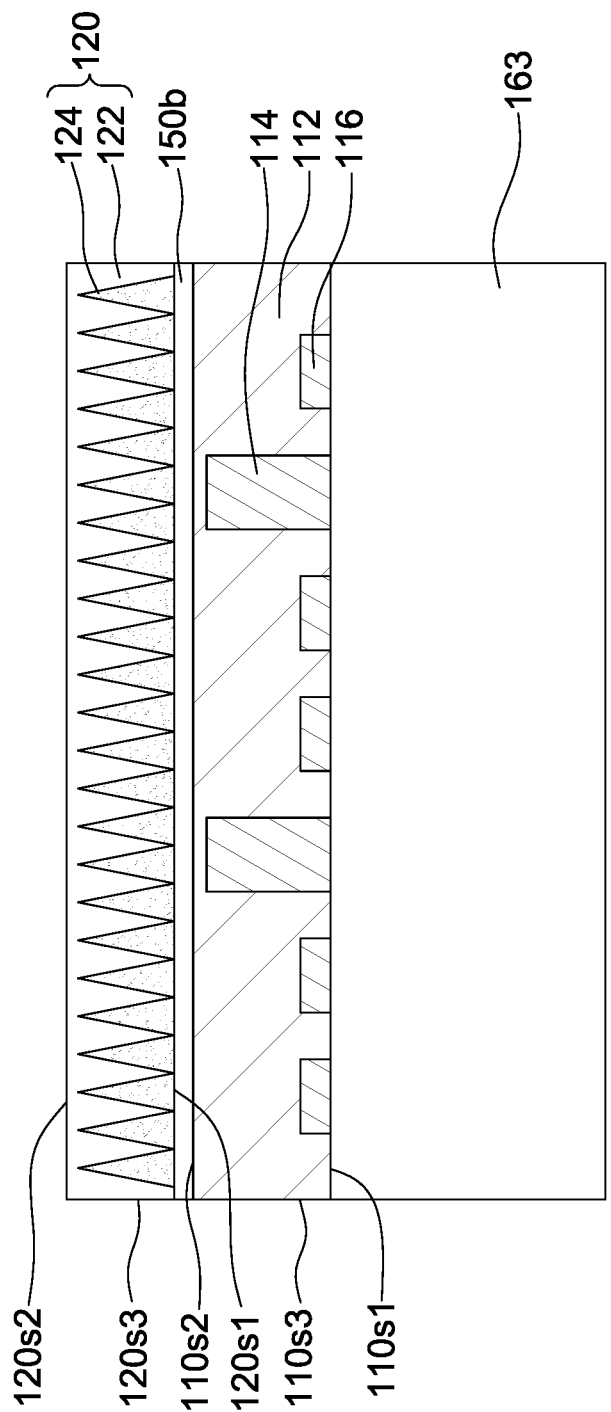

Referring to FIG. 7E, the carrier 162 may be removed. A carrier 163 is provided. The active surface 110*s*1 of the electronic component 110 is attached to the carrier 163. A thinning operation is performed on the substrate 122 of the passive component 120 such that the substrate 122 may have a thickness ranging from about 30 μm to about 100 μm.

Figure 7F:
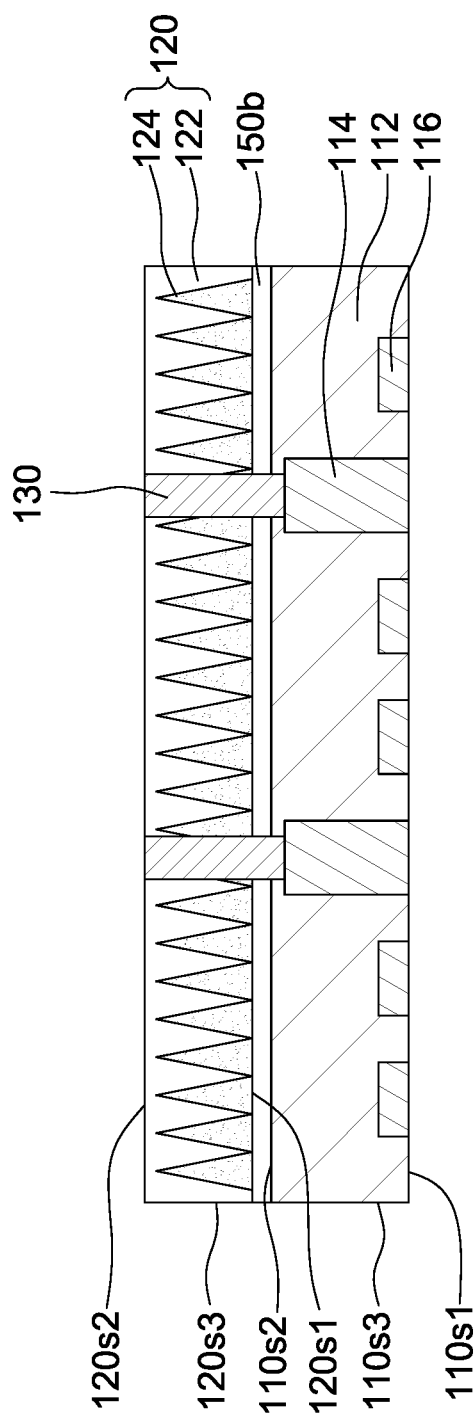

Referring to FIG. 7F, the carrier 163 may be removed, and a conductive element 130 may be formed. In some embodiments, an etching operation is performed to form openings fully penetrating the passive component 120 and partially penetrating the electronic component 110, and then a conductive material is formed in the openings to form the conductive element 130.

Figure 7G:
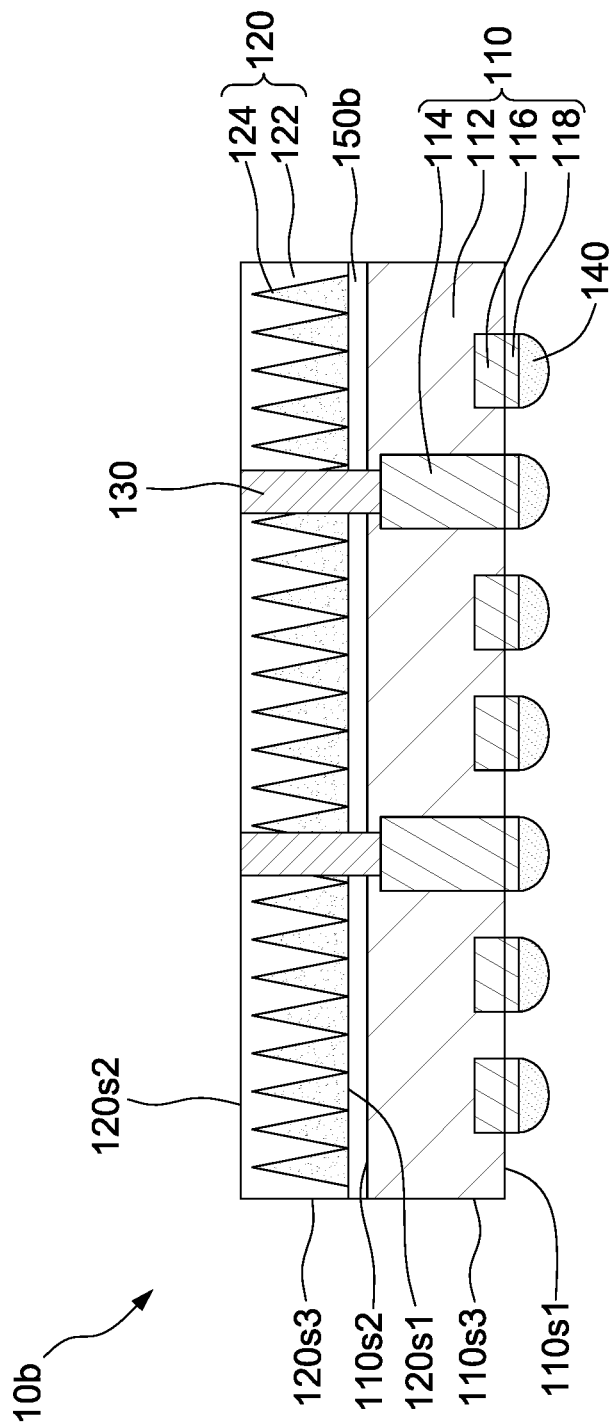

Referring to FIG. 7G, a conductive trace 118 and a conductive terminal 140 are formed on the active surface 110*s*1 of the electronic component 110. As a result, the semiconductor package structure 10*b* is formed.

Figure 8:
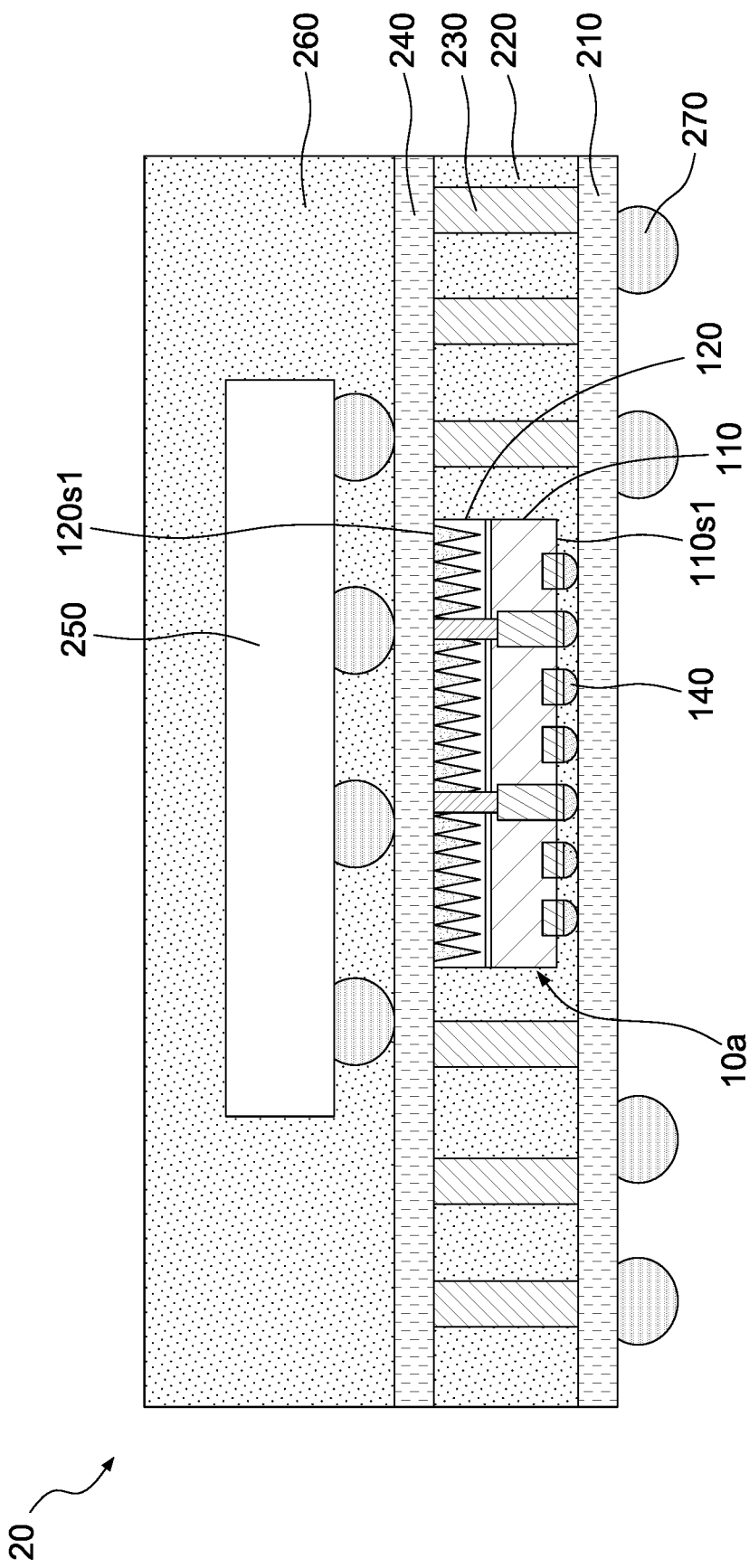
FIG. 8 illustrates a cross-sectional view of an example of a semiconductor package structure according to some embodiments of the present disclosure.

FIG. 8 illustrates a cross-sectional view of an example of a semiconductor package structure 20 according to some embodiments of the present disclosure. The semiconductor package structure 20 may have a structure similar to the semiconductor package structure 10*a* except that the semiconductor package structure 20 may further include a redistribution structure 210, an encapsulant 220, conductive pillars 230, a redistribution structure 240, an electronic component 250, an encapsulant 260 and conductive terminals 270.

The redistribution structure 210 may be disposed adjacent to the surface 110*s*1 of the electronic component 110. The redistribution structure 210 may be electrically connected to the conductive terminals 140. The redistribution structure

210 may include at least one dielectric layer. The redistribution structure 210 may also include conductive trace(s) and via(s) embedded in the dielectric layer. In some embodiments, the electronic component 110 may include a switch circuit to control the switch of the conductive path from the redistribution structure 210 to the electronic component 110 through the conductive terminals 140.

The encapsulant 220 may be disposed on redistribution structure 210. The encapsulant 220 may encapsulates the electronic component 110 and the passive component 120. The encapsulant 220 may include a Novolac-based resin, an epoxy-based resin, a silicone-based resin, or another suitable material.

The conductive pillars 230 may extend between the redistribution structures 210 and 240. The conductive pillars 230 may surround or encapsulate the electronic component 110 and the passive component 120. The conductive pillars 230 may be electrically connected to the redistribution structures 210 and 240, respectively.

The redistribution structure 240 may be disposed adjacent to the surface 120$s1$ of the passive component 120. The redistribution structure 240 may be disposed on the encapsulant 220. The redistribution structure 240 may be electrically connected to the passive component 120.

The electronic component 250 may be disposed on the redistribution structure 240. The electronic component 250 may be electrically connected to the passive component 120 by the redistribution structure 240. The electronic component 250 may include an active component.

The encapsulant 260 may be disposed on redistribution structure 240. The encapsulant 260 may encapsulates the electronic component 250. The encapsulant 260 may include a Novolac-based resin, an epoxy-based resin, a silicone-based resin, or another suitable material.

The conductive terminals 270 may be disposed on the redistribution structure 210. In some embodiments, the conductive terminal 270 may include solder balls (e.g., Sn ball).

In this embodiment, a signal transmission, such as power, may be transmitted to the electronic component 110 through the conductive terminals 270, the redistribution structure 210, the conductive pillar 230, the redistribution structure 240 and the passive component 120 in sequence. Thus, the power to the electronic component 110 may be adjusted and stabilized by the passive component 120.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
    an electronic component having a first surface, a second surface opposite to the first surface and a circuit structure closer to the first surface than to the second surface, wherein the electronic component is a semiconductor die comprising a transistor;

a passive component connected to the second surface of the electronic component; and a conductive element extending into the electronic component and configured to electrically connect the circuit structure with the passive component, wherein the passive component comprises a conductive structure, and the conductive element is disposed within the passive component and electrically connected to the conductive structure, and wherein the conductive element has a first portion within the electronic component, and the first portion is tapered toward the first surface of the electronic component, and wherein the conductive element has a second portion within the passive component, and a sidewall of the first portion is substantially aligned with a sidewall of the second portion in a cross-sectional view, and wherein the electronic component comprises a conductive via electrically connected to the conductive element, and an interface between the conductive via and the first portion of the conductive element is closer to the second surface of the electronic component than to the first surface of the electronic component.

2. The semiconductor package structure of claim 1, wherein a portion of a top surface of the conductive via is exposed by the conductive element.

3. The semiconductor package structure of claim 1, further comprising:

a dielectric structure disposed between the passive component and the electronic component, wherein the conductive element penetrates the dielectric structure.

4. The semiconductor package structure of claim 3, wherein the dielectric structure comprises silicon oxide.

5. A semiconductor package structure, comprising:

an electronic component having a first surface, a second surface opposite to the first surface and a circuit structure closer to the first surface than to the second surface, wherein the electronic component is a semiconductor die comprising a transistor;

a passive component connected to the second surface of the electronic component; and a conductive element extending into the electronic component and configured to electrically connect the circuit structure with the passive component, wherein the passive component comprises a conductive structure, and the conductive element is disposed within the passive component and electrically connected to the conductive structure, and wherein the conductive element has a first portion within the electronic component, and the first portion is tapered toward the first surface of the electronic component, and wherein the conductive element has a second portion within the passive component, and a sidewall of the first portion is substantially aligned with a sidewall of the second portion in a cross-sectional view, and wherein a thickness of the second portion is greater than a thickness of the first portion along a direction from the first surface to the second surface of the electronic component.

* * * * *